US006756085B2

(12) United States Patent
Waldfried et al.

(10) Patent No.: US 6,756,085 B2
(45) Date of Patent: Jun. 29, 2004

(54) ULTRAVIOLET CURING PROCESSES FOR ADVANCED LOW-K MATERIALS

(75) Inventors: Carlo Waldfried, Falls Church, VA (US); Qingyuan Han, Columbia, MD (US); Orlando Escorcia, Falls Church, VA (US); Ivan L. Berry, III, Ellicott City, MD (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/623,729

(22) Filed: Jul. 21, 2003

(65) Prior Publication Data

US 2004/0018319 A1 Jan. 29, 2004

Related U.S. Application Data

(63) Continuation-in-part of application No. 09/952,398, filed on Sep. 14, 2001.

(51) Int. Cl.$^7$ .................................................. C08J 7/04
(52) U.S. Cl. ............... 427/515; 427/249.1; 427/249.15; 427/255.2; 427/255.23; 427/255.29; 427/294; 427/385.5; 427/508; 427/558; 427/559; 427/569; 427/570; 427/574; 427/585
(58) Field of Search .............................. 427/515, 249.1, 427/249.15, 255.2, 255.23, 255.29, 294, 385.5, 508, 558, 559, 569, 570, 574, 585

(56) References Cited

U.S. PATENT DOCUMENTS

| 3,615,272 A | 10/1971 | Collins et al. |
| 4,636,440 A | 1/1987 | Iada |
| 4,749,631 A | 6/1988 | Haluska et al. |
| 4,756,977 A | 7/1988 | Haluska et al. |
| 4,808,653 A | 2/1989 | Haluska et al. |
| 4,842,888 A | 6/1989 | Haluska et al. |
| 4,847,162 A | 7/1989 | Haluska et al. |
| 4,999,397 A | 3/1991 | Weiss et al. |
| 5,008,320 A | 4/1991 | Haluska et al. |
| 5,010,159 A | 4/1991 | Bank et al. |
| 5,063,267 A | 11/1991 | Hanneman et al. |
| 5,116,637 A | 5/1992 | Baney et al. |
| 5,210,601 A | 5/1993 | Sajve et al. |
| 5,234,556 A | 8/1993 | Oishi et al. |
| 5,262,201 A | 11/1993 | Chandra et al. |
| 5,290,394 A | 3/1994 | Sasaki |
| 5,416,190 A | 5/1995 | Mine et al. |
| 5,523,163 A | 6/1996 | Ballance et al. |

(List continued on next page.)

FOREIGN PATENT DOCUMENTS

| JP | 59-178749 A | 10/1984 |
| JP | 60-086017 A | 5/1985 |
| JP | 62-149308 A | 7/1987 |
| JP | 63-107122 A | 5/1988 |

OTHER PUBLICATIONS

Glaser, P.M. and Pantano, C.G., "Effect of the H20/TEOS Ratio Upon the Preparation and Nitridation of Silica Sol/Gel Films" Elsevier Science Publishers B.V., Journal of Non-Crystalline Solids 63 (1994), pp. 209–221 (No month avail.).

Primary Examiner—Bernard Pianalto
(74) Attorney, Agent, or Firm—Dinsmore & Shohl LLP (57) ABSTRACT

Low dielectric constant materials with improved elastic modulus and material hardness. The process of making such materials involves providing a dielectric material and ultraviolet (UV) curing the material to produce a UV cured dielectric material. UV curing yields a material with improved modulus and material hardness. The improvement is each typically greater than or about 50%. The UV cured dielectric material can optionally be post-UV treated. The post-UV treatment reduces the dielectric constant of the material while maintaining an improved elastic modulus and material hardness as compared to the UV cured dielectric material. UV cured dielectrics can additionally exhibit a lower total thermal budget for curing than for furnace curing processes.

58 Claims, 4 Drawing Sheets

U.S. PATENT DOCUMENTS

| | | |
|---|---|---|
| 5,547,703 A | 8/1996 | Camilletti et al. |
| 5,618,878 A | 4/1997 | Syktich et al. |
| 5,853,808 A | 12/1998 | Arkles et al. |
| 5,879,744 A | 3/1999 | Cao et al. |
| 5,935,646 A | 8/1999 | Raman et al. |
| 6,143,360 A | 11/2000 | Zhong |
| 6,184,260 B1 | 2/2001 | Zhong |
| 6,231,989 B1 | 5/2001 | Chung et al. |
| 6,232,424 B1 | 5/2001 | Zhong et al. |
| 6,284,050 B1 | 9/2001 | Shi et al. |
| 6,303,192 B1 | 10/2001 | Annapragada et al. |
| 6,313,045 B1 | 11/2001 | Zhong et al. |
| 6,359,096 B1 | 3/2002 | Zhong et al. |
| 6,383,955 B1 | 5/2002 | Matsuki et al. |
| 6,475,564 B1 | 11/2002 | Carter et al. |
| 6,544,858 B1 | 4/2003 | Beekman et al. |
| 6,558,747 B2 | 5/2003 | Nakata et al. |
| 6,558,755 B2 | 5/2003 | Berry, III et al. |
| 6,576,300 B1 | 6/2003 | Berry, III et al. |
| 2002/0136910 A1 | 9/2002 | Hacker |

ULTRAVIOLET CURING PROCESSES FOR ADVANCED LOW-K MATERIALS

CROSS-REFERENCE TO RELATED APPLICATIONS

This application is a continuation-in-part of U.S. patent application Ser. No. 09/952,398, filed Sep. 14, 2001 and entitled "ULTRAVIOLET CURING PROCESS FOR POROUS LOW-K MATERIALS", which is related to U.S. patent application Ser. No. 09/528,835, filed Mar. 20, 2000 and entitled "HIGH MODULUS, LOW DIELECTRIC CONSTANT COATINGS" (now U.S. Pat. No. 6,576,300) and U.S. patent application Ser. No. 09/681,332, filed Mar. 19, 2001 and entitled "PLASMA CURING PROCESS FOR POROUS SILICA THIN FILM" (now U.S. Pat. No. 6,558,755), the disclosures of which are incorporated herein by reference.

BACKGROUND OF THE INVENTION

This invention relates generally to a process which is employed in manufacturing semiconductor chips. More particularly, the invention relates to a process for improving the structural properties and reliability of certain materials that are utilized as integrated circuit (IC) dielectrics.

New materials with low dielectric constants (known in the art as "low-k dielectrics") are being investigated for their potential use as insulators in semiconductor chip designs. A low dielectric constant material aids in enabling further reductions in the integrated circuit feature dimensions. In conventional IC processing, $SiO_2$ is used as a basis for the dielectric material resulting in a dielectric constant of about 3.9. Moreover, advanced dense low-k dielectric materials have dielectric constants below about 2.8. The substance with the lowest dielectric constant is air (k=1.0). Therefore, porous dielectrics are very promising candidates since they have the potential to provide very low dielectric constants. Unfortunately, however, advanced low-k dielectrics typically have the problem of insufficient mechanical strength and deposition temperatures of these materials can exceed allowable thermal budgets.

Thin film dielectric coatings on electric devices are known in the art. For instance, U.S. Pat. Nos. 4,749,631 and 4,756,977, to Haluska et al., disclose silica based coatings produced by applying solutions of silicon alkoxides or hydrogen silsesquioxane, respectively, to substrates and then heating the coated substrates to a temperature between 200 and 1000° C. The dielectric constant of these coatings is often too high for certain electronic devices and circuits.

U.S. Pat. Nos. 4,847,162 and 4,842,888, to Haluska et al., teach the formation of nitrided silica coatings by heating hydrogen silsesquioxane resin and silicate esters, respectively, to a temperature between 200 and 1000° C. in the presence of ammonia.

Glasser et al., Journal of Non-Crystalline Solids, 64 (1984) pp. 209–221, teaches the formation of ceramic coatings by heating tetraethoxysilane in the presence of ammonia. This reference teaches the use of anhydrous ammonia and that the resulting silica coatings are nitrided.

U.S. Pat. No. 4,636,440, to Jada, discloses a method of reducing the drying time for a sol-gel coated substrate comprising exposing the substrate to aqueous quaternary ammonium hydroxide and/or alkanol amine compounds. Jada requires that the coating be dried prior to heating. It is specifically limited to hydrolyzed or partially hydrolyzed silicon alkoxides.

U.S. Pat. No. 5,262,201, to Chandra et al., and U.S. Pat. No. 5,116,637, to Baney et al., teach the use of basic catalysts to lower the temperature necessary for the conversion of various preceramic materials, all involving hydrogen silsesquioxane, to ceramic coatings. These references teach the removal of solvent before the coating is exposed to the basic catalysts.

U.S. Pat. No. 5,547,703, to Camilletti et al., teaches a method for forming low dielectric constant Si—O containing coatings on substrates comprising heating a hydrogen silsesquioxane resin successively under wet ammonia, dry ammonia, and oxygen. The resultant coatings have dielectric constants as low as 2.42 at 1 MHz. This reference teaches the removal of solvent before converting the coating to a ceramic.

U.S. Pat. No. 5,523,163, to Balance et al., teaches a method for forming Si—O containing coatings on substrates comprising heating a hydrogen silsesquioxane resin to convert it to a Si—O containing ceramic coating and then exposing the coating to an annealing atmosphere containing hydrogen gas. The resultant coatings have dielectric constants as low as 2.773. The reference teaches the removal of solvent before converting the coating to a ceramic.

U.S. Pat. No. 5,618,878, to Syktich et al., discloses coating compositions containing hydrogen silsesquioxane resin dissolved in saturated alkyl hydrocarbons useful for forming thick ceramic coatings. The alkyl hydrocarbons disclosed are those up to dodecane. The reference does not teach exposure of the coated substrates to basic catalysts before solvent removal.

U.S. Pat. No. 6,231,989, to Chung et al., entitled "METHOD OF FORMING COATINGS", discloses a method of making porous network coatings with low dielectric constants. The method comprises depositing a coating on a substrate with a solution comprising a resin containing at least 2 Si—H groups and a solvent in a manner in which at least 5 volume % of the solvent remains in the coating after deposition. The coating is then exposed to an environment comprising a basic catalyst and water. Finally, the solvent is evaporated from the coating to form a porous network. If desired, the coating can be cured by heating to form a ceramic. Films made by this process have dielectric constants in the range of 1.5 to 2.4 with an elastic modulus between about 2 and about 3 GPa.

Low-k dielectric materials produced by spin-on and chemical vapor deposition processes or by a self-assembly process typically require a curing process subsequent to the deposition. Typical process conditions for curing low-k films include nitrogen purged furnace anneals at temperatures between about 350 and about 450° C. for 30 to 180 minutes. As was described in U.S. patent application Ser. Nos. 09/681,332 (now U.S. Pat. No. 6,558,755), 09/952,649, 09/906,276, 09/952,398, and 10/627,894, the disclosures of which are incorporated herein by reference, instead of thermally curing or plasma treating, the low-k films can be UV cured at substantially shorter times or at lower temperatures, eliminating the need for prior furnace curing and therefore reducing the total thermal budget.

Moreover, there remains a need for a process for making other low-k materials with improved structural properties, such as improved elastic modulus and material hardness, without compromising or deteriorating its electrical properties.

SUMMARY OF THE INVENTION

The present invention meets that need by providing an ultraviolet curing process for advanced low-k materials.

Although the present invention is not limited to specific advantages or functionality, it is noted that the process produces materials having a low dielectric constant and an improved elastic modulus and material hardness, or produces materials with comparable modulus and hardness and can reduce the total thermal budget as compared to a furnace cure.

In accordance with one embodiment of the present invention, a process is provided for making a UV cured material comprising providing a dielectric material having a first dielectric constant, having a first elastic modulus, and having a first material hardness. The dielectric material is cured with ultraviolet (UV) radiation to produce a UV cured dielectric material having a second dielectric constant which is comparable to the first dielectric constant, having a second elastic modulus which is greater than the first elastic modulus, and having a second material hardness which is greater than the first material hardness. By "comparable to" we mean within about ±20% of the first dielectric constant. The increase in elastic modulus and material hardness is typically greater than or about 50%.

The UV cured dielectric material can optionally be post-UV treated to provide a post-UV treated, UV cured dielectric material having a third dielectric constant, having a third elastic modulus, and having a third material hardness. Post-UV treatment of the UV cured dielectric material reduces the dielectric constant of the material while maintaining the increase in the elastic modulus and material hardness, as compared to the elastic modulus and material hardness before the post-UV treatment. More particularly, the third elastic modulus and material hardness are greater than or within about ±20% of the second elastic modulus and material hardness, respectively.

The process for making a UV cured material can further comprise placing the dielectric material into a process chamber, evacuating or purging the process chamber to remove room air, supplying a process gas to the process chamber, heating the dielectric material, and exposing the dielectric material to UV radiation.

In accordance with another embodiment of the present invention, a process for making a UV cured material is provided comprising providing an uncured low-k dielectric material, and UV curing the dielectric material at a time of no greater than about 5 minutes, or at a temperature of no greater than about 450° C. to produce a UV cured dielectric material, wherein the total thermal budget of the UV curing is reduced by greater than about 50% as compared to a furnace curing process.

Accordingly, it is an object of the present invention to produce dielectric materials having improved elastic modulus and material hardness, and a low dielectric constant.

Additionally, it is a object of this invention to produce dielectric materials wherein the process of formation and curing occurs at a reduced time or reduced temperature or both, resulting in a decreased thermal budget for the process.

These and other features and advantages of the invention will be more fully understood from the following detailed description of the invention taken together with the accompanying drawings. It is noted that the scope of the claims is defined by the recitations therein and not by the specific discussion of features and advantages set forth in the present description.

BRIEF DESCRIPTION OF THE DRAWINGS

The following detailed description of the embodiments of the present invention can be best understood when read in conjunction with the following figures, where like structure is indicated with like reference numerals and in which.

Skilled artisans appreciate that elements in the figures are illustrated for simplicity and clarity and have not necessarily been drawn to scale. For example, the dimensions of some of the elements in the figures may be exaggerated relative to other elements to help improve understanding of the embodiments of the present invention.

DETAILED DESCRIPTION OF THE INVENTION

The present invention is based on the discovery that UV curing virtually any dielectric material can be done substantially quicker than in a furnace cure and can in general, increase the elastic modulus (Young's modulus) and material hardness of the material while maintaining its low dielectric constant properties. The dielectric material can include, but is not limited to, organic materials, inorganic materials, or combinations thereof. More particularly, the dielectric material can include, but is not limited to, hydrogen silsesquioxane (HSQ) dielectric materials, methylsilsesquioxane (MSQ) dielectric materials, carbon doped oxide (CDO) dielectric materials, hydrogenated silicon oxycarbide (SiCOH) dielectric materials, benzocyclobutene (BCB) dielectric materials, arylcyclobutene-based dielectric materials, polyphenylene-based dielectric materials, and combinations thereof, which can be produced by depositing a dielectric coating on a substrate using spin-on, chemical vapor deposition (CVD), plasma assisted CVD, evaporation, reactive evaporation, or self-assembled processes. The dielectric material can be either porous or dense. The porous dielectric materials can have porogen-generated, solvent-formed, or molecular engineered pores, which may be interconnected or closed, and which may be distributed random or ordered, such as vertical pores.

For some low-k materials, post-UV treating UV cured dielectric materials, using different wavelengths or temperatures, produces a material having a lower dielectric constant, and of equal or further improved elastic modulus and material hardness.

The process of the present invention is particularly applicable to the deposition of coatings on electronic devices or electronic circuits where they can serve as interlevel dielectric layers, doped dielectric layers to produce transistor-like devices, pigment loaded binder systems containing silicon to produce capacitor and capacitor-like devices, multilayer devices, 3-D devices, silicon on insulator devices, super lattice devices, and the like. However, the choice of substrates and devices to be coated by the instant invention is limited only by the need for thermal and chemical stability of the substrate at the temperature and pressure used in the present invention. As such, the dielectric materials of the present invention can be used on substrates such as plastics including, for example, polyimides, epoxies, polytetrafluoroethylene and copolymers thereof, polycarbonates, acrylics and polyesters, ceramics, leather, textiles, metals, semiconductors and the like.

As used in the present invention, the expression "ceramic" includes ceramics such as amorphous silica and ceramic-like materials such as amorphous silica-like materials that are not fully free of carbon and/or hydrogen but are otherwise ceramic in character. The expressions "electronic device" or "electronic circuit" include, but are not limited to, silicon-based devices, gallium arsenide based devices, silicon carbide based devices, focal plane arrays, optoelectronic devices, photovoltaic cells, and optical devices.

A dielectric material is needed as a starting material for the present invention. One such material is an advanced CVD low-k film such as, for example, AURORA®, a hydrogenated silicon oxy-carbide (SiCOH) dielectric material available from ASM International N.V. (Bilthoven, the Netherlands). Such advanced low-k dielectric materials are produced using a plasma enhanced chemical vapor deposition process and typically have a k value of about 2.5 or less. Other examples of CVD low-k materials include Black Diamond® films available from Applied Materials® Inc. (Santa Clara, Calif.), Coral® low-k materials available from Novellus Systems Inc. (San Jose, Calif.), and Orion® materials available from Trikon Technologies Inc. (Newport, South Wales, UK). Typical spin-on based dielectric materials for use with the present invention include: 1) FOx HSQ-based dielectric material and XLK porous HSQ-based dielectric material available from Dow Corning Corporation (Midland, Mich.), and 2) low-k porous dielectric MSQ-based materials, available from Chemat Technology, Inc. (Northridge, Calif.) and JSR Corporation (Tokyo, Japan).

The production of typical advanced low-k dielectric materials for use with the present invention is well known in the art. One method of making such a dielectric material is the porous network coating disclosed in U.S. Pat. No. 6,231,989, which is incorporated herein by reference for its teaching on how to produce porous dielectric materials having ultra low dielectric constants. The patent describes the manufacture of ultra low dielectric constant coatings having a dielectric constant between about 1.5 and about 2.4, in which pores are introduced into HSQ-based films. HSQ-based films produced according to the method taught in U.S. Pat. No. 6,231,989, which have been cured under thermal conditions, contain about 20 to about 60% Si—H bonds density. When the dielectric constant of the coating is about 2.0, the coating has an elastic modulus of between about 2 and about 3 GPa.

A second method for making an advanced low-k dielectric is disclosed in U.S. Pat. No. 6,558,747 which describes the formation of organosilicon oxide dielectric films that have a dielectric constant as low as from 2.5 to 3.0. Alternate methods are described in U.S. Pat. No. 6,475,564 wherein an advanced low-k dielectric is formed by reacting a silicon containing gas with a peroxide compound in a chemical vapor deposition system, and U.S. Pat. No. 6,383,955 that describes the formation of a SiCOH based advanced low-k material by a plasma CVD process.

Another method of making and advanced low-k material is to thermally cure a siloxane resin containing large alkyl groups and to thermally decompose the alkyl groups to create porosity in the coating. As disclosed in U.S. Pat. Nos. 6,143,360 and 6,184,260, to Zhong, which are hereby incorporated herein by reference, hydridosilicon containing resin was allowed to contact with a 1-alkene comprising about 8 to about 28 carbon atoms in the presence of a platinum group metal-containing hydrosilation catalyst, effecting formation of an alkylhydridosiloxane resin where at least about 5 percent of the silicon atoms are substituted with at least one hydrogen atom, and the resulting resin was heated at a temperature sufficient to effect curing of the resin and thermolysis of alkyl groups from the silicon atoms, thereby forming a nanoporous silicone resin.

U.S. Pat. Nos. 6,232,424, 6,359,096 and 6,313,045, and U.S. patent application Ser. No. 425,901, to Zhong et al., which are hereby incorporated herein by reference, disclose silicone resins and porous coatings made from the silicone resins. The silicone resins are made from a mixture compromising 15 to 70 mol % of tetraalkoxysilane, 12 to 60 mol % of an organosilane described by formula R'SiX$_3$, where R' is a hydrogen or alkyl group containing 1 to 6 carbon atoms, and 15 to 70 mol % of an organotrialkyoxysilane described by formula R"Si(OR''')$_3$, where R" is a hydrocarbon group compromising about 8 to 24 carbon atoms or a substituted hydrocarbon group compromising a hydrocarbon chain having about 8 to 24 carbon atoms.

U.S. patent application Ser. No. 09/951,819 entitled "SILICONE RESINS AND POROUS MATERIALS PRODUCED THEREFROM", to Zhong, filed Sep. 12, 2001 and hereby incorporated herein by reference, discloses porous coatings made from silicone resins having the general formula $(R^1SiO_{3/2})_x(HSiO_{3/2})_y$ where $R^1$ is an alkyl group having 8 to 24 carbon atoms. The coatings produced therein have a dielectric constant between 1.5 and 2.3. The above-referenced patent application further provides the following description of a porous low-k dielectric coating made in two steps from a resin with a formula of $(R^1SiO_{3/2})_x(HSiO_{3/2})_y$ where $R^1$ is 3,7,11,15-tetramethyl-3-hydroxy-hexadecyl.

U.S. patent application Ser. No. 09/951,899 entitled "SILICONE RESINS AND POROUS MATERIALS PRODUCED THEREFROM", to Zhong, filed Sep. 12, 2001 and hereby incorporated herein by reference, discloses porous coatings made from silicone resins having the general formula $(R^1SiO_{3/2})_u(HSiO_{3/2})_v(SiO_{4/2})_w(HOSiO_{3/2})_z$ where $R^1$ is a branched alkyl group having 8 to 24 carbon atoms containing at least one electron-withdrawing group in a pendant position on the alkyl chain; u has a value of 0.1 to 0.7; v has a value of 0.12 to 0.6; $z \geq 0.5$; w+z has a value of 0.15 to 0.7; and u+v+w+z=1.

Step 1. A resin sample was prepared by combining components (A), (B), (C), (D), (E), and (F) as described below in the amounts described in Table 1 of the above-referenced U.S. patent application:

(A) 0.45 mole parts of triethoxysilane,
(B) 0.25 mole parts of an organotriethoxysilane, RSi(OR')$_3$ where R is 3,7,11,15-tetramethyl-3-hydroxy-hexadecyl,
(C) 0.30 mole parts of tetraethoxysilane, and
(D) a mixture of methyl isobutyl ketone (MIBK) and isobutyl isobutyrate (6:4 weight ratio), enough to make the concentration of the resulting resin 9%.

To this mixture was added a mixture of (E) water and (F) hydrogen chloride in the amounts described in Table 1 of the above-referenced application. The resulting reaction product was stripped of volatiles under reduced pressure at 60° C. until the solid content became 14 to 21%. Isobutyl isobutyrate was added to make the solid content 14%. The solution was then heated to reflux for 2 hours and water produced was removed continuously. The solvent was then changed to cyclohexanone by stripping off isobutyl isobutyrate and adding cyclohexanone.

Step 2. The resulting resin solution was spin-coated onto silicon wafers suitable for dielectric constant measurements, and cured in a nitrogen flow at 440° C. for 1 hour. The dielectric constant was measured as 1.9. Alternatively, the curing of the spin-coated films may be accelerated with plasma and/or UV assisted processes.

U.S. patent application Ser. No. 09/915,899, to Albaugh et al., which is hereby incorporated herein by reference, discloses porous coatings from resins containing $(RSiO_{3/2})$ $(R'SiO_{3/2})(R''SiO_{3/2})$ resins wherein R is an alkyl group having 1 to 5 carbon atoms or a hydrogen atom, R' is a branched alkoxy group and R'' is a substituted or un-substituted linear, branched, or cyclic monovalent organic group having 6 to 30 carbon atoms.

U.S. patent application Ser. No. 09/915,903, to Boisvert et al., and U.S. patent application Ser. No. 09/915,902, to Albaugh et al., which are hereby incorporated herein by reference, disclose porous coatings made from resins of the formula TRTR' where R is either a methyl or hydrogen group and a R' is a branched alkoxy group.

Although dielectric materials having low dielectric constants are desirable, it would be advantageous to have a dielectric material with a higher elastic modulus and material hardness.

In order to raise the elastic modulus of the dielectric material, it is exposed to a UV curing process. The UV curing process improves the mechanical properties of the low-k dielectric material, increasing material hardness while maintaining the dielectric pore, structure, density, and electrical properties.

In a typical UV curing process, a UV radiator tool is utilized, which is first purged with nitrogen, helium, or argon to allow the UV radiation to enter the process chamber with minimal spectral absorption. The dielectric material is positioned within the process chamber, which is purged separately and process gases, such as $N_2$, $H_2$, Ar, He, Ne, $H_2O$ vapor, $CO_2$, $O_2$, $C_xH_y$, $C_xF_y$, $C_xH_zF_y$, and mixtures thereof, wherein x is an integer between 1 and 6, y is an integer between 4 and 14, and z is an integer between 1 and 3, may be utilized for different applications. In this regard, UV curing can occur at vacuum conditions, or at conditions without the presence of oxygen or oxidizing gases. UV generating bulbs with different spectral distributions may be selected depending on the application such as, for example, HL or HL-bulbs available from Axcelis Technologies (Beverly, Mass.). As such, the UV light source can be microwave driven, arc discharge, dielectric barrier discharge, or electron impact generated. The wafer temperature may be controlled ranging from about room temperature to about 450° C., optionally by an infrared light source, an optical light source, a hot surface, or the UV light source itself. The process pressure can be less than, greater than, or about equal to atmospheric pressure.

Examples of typical UV cure conditions for a 200 mm wafer are shown below.

| | |
|---|---|
| UV Power: | $0.1$ mW–$2000$ mW/cm$^2$ |
| UV wavelength: | continued spectral distribution from 100–600 nm |
| Wafer Temperature: | room temp. - 450° C. |
| Process Pressure: | <, >, or = to atmospheric |
| UV Cure Time: | <300 seconds |
| Process Gases: | He/Ne/Ar/$H_2$/$N_2$/$H_2O$/CO/$CO_2$/$C_xH_y$/$O_2$/$C_xH_zF_y$ |

The elastic modulus and material hardness of the UV cured dielectric materials are increased as compared to furnace (thermally) cured or uncured dielectric materials. A furnace cured or uncured advanced low-k material has typically an elastic modulus between about 0.5 GPa and about 8 GPa when the dielectric constant is between about 1.6 and about 2.7. Typically, the elastic modulus of the UV cured dielectric material is greater than or about 2.5 GPa, and more typically between about 4 GPa and about 12 GPa. The material hardness of the furnace cured or uncured films is about 0.1 GPa. Typically, the material hardness of the UV cured dielectric material is greater than or about 0.25 GPa, and more typically between about 0.25 GPa and about 1.2 GPa.

Additionally, the UV curing process is typically operated at about 420° C. or less at times from about 20 seconds to about 5 minutes, whereas furnace cures typically operate at about 420° C. for 30 minutes to 3 hours. The UV curing process therefore reduces the total thermal budget over a furnace cure.

The UV cured dielectric materials of the present invention have improved chemical stability and improved dimensional stability. By improved "chemical stability", we mean that the dielectric materials are more resistant to chemicals, such as cleaning solutions and chemical polishing solutions, and plasma damaging during photoresist ashing and dry etching processes.

However, for some low-k materials and process gas combinations, the UV cure process can generate some unwanted polar species in the dielectric materials. In these cases, the UV cured dielectric materials can optionally be post-UV treated using thermal, UV, or plasma exposure to reduce the dielectric constant and/or further increase the elastic modulus and material hardness, if desired. For example, the UV cured dielectric materials can be annealed by placing the materials in a conventional oven until the polar species are removed, such as at a temperature of between about 400° C. and about 450° C. for between about 30 and about 60 minutes. An alternative process for annealing the materials involves annealing the UV cured dielectric materials in a Rapid Anneal Processing (RAP) chamber in order to reduce the dielectric constant. The UV cured dielectric material is annealed at a typical temperature for a sufficient time, and cooled to about 100° C. However, RAP may not be necessary in most applications.

Typical operating conditions for the RAP process are shown below.

| | |
|---|---|
| Ramp rate: | 15–150° C./sec |
| Wafer Temperature: | 150–450° C. |
| Annealing Time: | <120 seconds |
| Process Pressure: | atmospheric |
| Atmosphere: | $N_2$ |

The post-UV treatment can also be performed by exposing the UV cured dielectric material to an additional UV condition. Typically, the UV cured dielectric material is UV treated for no more than or about 300 seconds and, more particularly, between about 60 and about 180 seconds. Also, UV treating can be performed at a temperature between about room temperature and about 450° C.; at a process pressure that is less than, greater than, or about equal to atmospheric pressure; at a UV power between about 0.1 and about 2000 mW/cm$^2$; and a UV wavelength spectrum between about 100 and about 400 nm. Moreover, the UV cured dielectric material can be UV treated with a process gas purge, such as $N_2$, $O_2$, Ar, He, $H_2$, $H_2O$ vapor, $CO_2$, $C_xH_y$, $C_xF_y$, $C_xH_zF_y$, air, and combinations thereof, wherein x is an integer between 1 and 6, y is an integer between 4 and 14, and z is an integer between 1 and 3.

Another type of post-UV treatment that can be used involves the exposure of the UV cured dielectric materials to a plasma condition at elevated temperatures. In a typical plasma-assisted post-UV treatment, process gases, such as $O_2$, $N_2$, $H_2$, Ar, He, $C_xH_y$, fluorine-containing gas, and mixtures thereof, wherein x is an integer between 1 and 6, and y is an integer between 4 and 14, may be utilized for different applications. The wafer temperature may be controlled ranging from about room temperature to about 450° C. Typically, the UV cured dielectric material is plasma treated at a process pressure between about 1 Torr and about 10 Torr.

Examples of typical plasma-assisted post-UV treatment conditions for 200 mm and 300 mm wafers are shown below.

| Condition | 200 mm system | 300 mm system |
|---|---|---|
| Microwave Plasma Power: | 500 W–3000 W | 500 W–3000 W |
| Wafer Temperature: | 80° C.–350° C. | 80° C.–350° C. |
| Process Pressure: | 1.0 Torr–3.0 Torr | 1.0 Torr–4.0 Torr |
| Plasma Treatment Time: | <90 seconds | <90 seconds |
| Process Gases: | $H_2/N_2/CF_4/O_2/Ar/He/C_xH_y$ | $H_2/N_2/CF_4/O_2/Ar/He/C_xH_y$ |
| $N_2H_2$ Flow Rate: | >0–4000 sccm | >0–10,000 sccm |
| $O_2$ Flow Rate: | >0–4000 sccm | >0–10,000 sccm |
| $CF_4$ Flow Rate: | >0–400 sccm | >0–1000 sccm |
| Ar Flow Rate: | >0–4000 sccm | >0–10,000 sccm |
| He Flow Rate: | >0–4000 sccm | >0–10,000 sccm |

The dielectric constant of the post-UV treated, UV cured dielectric materials is reduced as compared to the UV cured dielectric materials. The dielectric constant of the post-UV treated, UV cured dielectric materials is typically between about 1.1 and about 3.5, and more typically between about 1.6 and about 2.4.

Typical material properties of porous low-k films with UV curing are shown in Table 1 below.

TABLE 1

Porous Low-K Material Characteristics with UV Curing

| Material Properties | MSQ-Based Dielectric Material | HSQ-Based Dielectric Material |
|---|---|---|
| Change in Dielectric Constant | <0.1 | <0.2 |
| Modulus Increase | ≧50% | ≧50% |
| Porosity | Unchanged | Unchanged |
| Compatible UV Curing Process gases | Vacuum, Ar, He, Ne, $H_2$, $NH_3$, $CO_2$, CO, $N_2/H_2$ | Vacuum, $N_2/H_2$, Ar, He, Ne, $NH_3$, $O_2$, $H_2$, $H_2O$ |
| Density | Unchanged | Unchanged |
| Thickness Loss | <10% | <10% |
| Refractive Index Change | <0.01 | <0.03 |

Typical material properties of advanced dense low-k films with UV curing are shown in Table 2 below.

TABLE 2

Advanced Dense Low-k Material Characteristics with UV Curing

| | Sample # | Bulb | Time (sec.) | Temp. (° C.) | Modulus | Hardness | Average Modulus | Average Hardness | % Improvement Modulus | % Improvement Hardness |
|---|---|---|---|---|---|---|---|---|---|---|
| | Control SiCOH low-k Dielectric | | | | 6.3 | 0.81 | 6.27 | 0.80 | N/A | N/A |
| | | | | | 6.1 | 0.80 | | | | |
| | | | | | 6.4 | 0.80 | | | | |
| $N_2$ process gas | 1 | HL- | 30 | 360 | 6.7 | 0.85 | 6.63 | 0.86 | 5.9 | 7.1 |
| | | | | | 6.6 | 0.87 | | | | |
| | | | | | 6.6 | 0.86 | | | | |
| | 2 | Hmod | 180 | 360 | 7.3 | 0.99 | 7.17 | 0.97 | 14.4 | 20.3 |
| | | | | | 7.0 | 0.95 | | | | |
| | | | | | 7.2 | 0.96 | | | | |
| | 3 | Dmod | 180 | 360 | 6.6 | 0.93 | 6.40 | 0.90 | 2.1 | 12.0 |
| | | | | | 6.2 | 0.86 | | | | |
| | | | | | 6.4 | 0.91 | | | | |

TABLE 2-continued

Advanced Dense Low-k Material Characteristics with UV Curing

| | Sample # | Bulb | Time (sec.) | Temp. (° C.) | Modulus | Hardness | Average Modulus | Average Hardness | % Improvement Modulus | % Improvement Hardness |
|---|---|---|---|---|---|---|---|---|---|---|
| He process gas | A | HL- | 180 | 360 | 9.3 | 1.00 | 9.13 | 1.00 | 45.7 | 24.5 |
| | | | | | 9.1 | 0.97 | | | | |
| | | | | | 9.0 | 1.03 | | | | |
| | B | HL- | 120 | 360 | 8.2 | 1.07 | 8.37 | 1.04 | 33.5 | 29.5 |
| | | | | | 8.5 | 1.01 | | | | |
| | | | | | 8.4 | 1.04 | | | | |

In order that the invention may be more readily understood, reference is made to the following examples, which are intended to illustrate the invention, but not limit the scope thereof.

The following graphs show the attributes of the UV curing. Examples are presented for (i) MSQ-based low-k films, (ii) HSQ-based low-k films, (iii) MSQ/HSQ mixed low-k films, and (iv) plasma enhanced CVD deposited SiCOH low-k films, all with a thickness of approximately 5000 Å.

EXAMPLE 1

MSQ-Based Low-k Film

Figure 1:
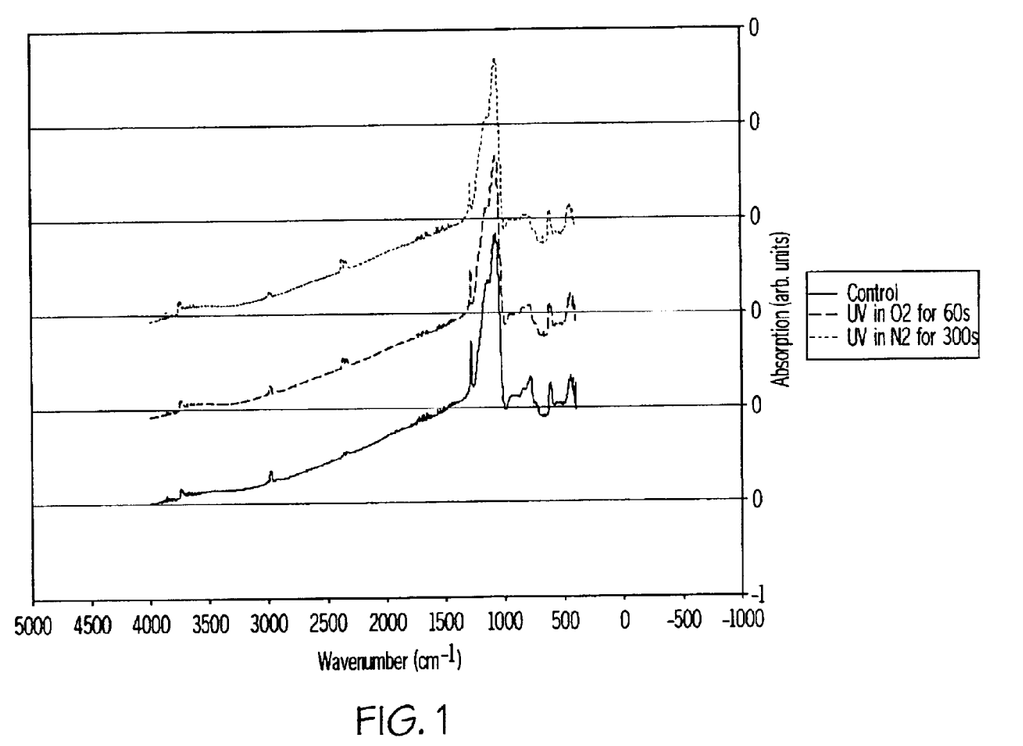
FIG. 1 is a chart illustrating the FTIR spectra for MSQ-based spin-on low-k films which were thermally cured, thermally cured and UV cured in $O_2$, and thermally cured and UV cured in $N_2$.

The FTIR spectra of MSQ-based low-k films are characterized by Si—$CH_3$ characteristic bands near 1280 $cm^{-1}$ and 3000 $cm^{-1}$, as well the two Si—O peaks near 1100 $cm^{-1}$. The UV curing of these films which typically results in a modulus increase of 100% or more is reflected in the FTIR spectra by the partial removal of the Si—$CH_3$ bands, and the change in the ratio of cage (higher wavenumber) vs. network (lower wavenumber) Si—O bonds.

The UV treatment can successfully cure the MSQ-based porous low-k films. FIG. 1 shows FTIR spectra for MSQ-based porous low-k films: thermally cured (bottom), thermally+UV cured in $O_2$ for 1 minute (center), and thermally+UV cured in $N_2$ for 5 minutes (top). The curing effectiveness is strongly dependent on the chamber purge gas composition. It has been observed that $O_2$ is more effective for the UV curing than $N_2$.

EXAMPLE 2

HSQ-Based Low-k Film

Figure 2:
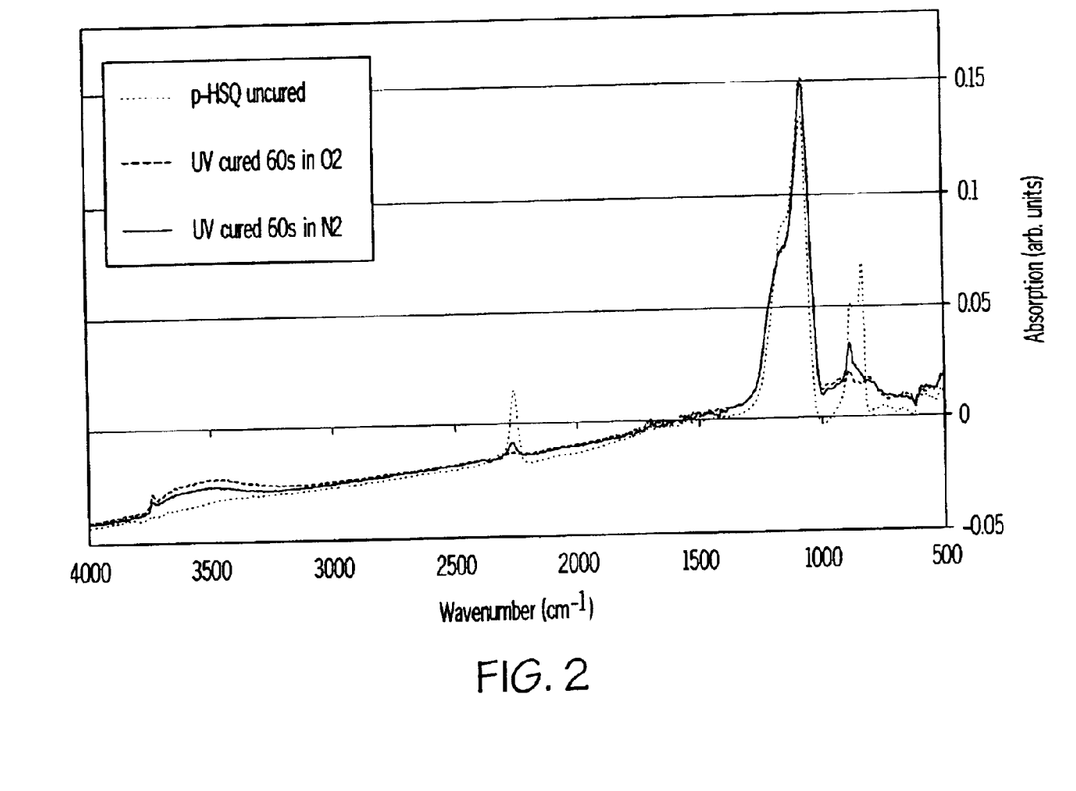
FIG. 2 is a chart illustrating the FTIR spectra for HSQ-based spin-on low-k films which were uncured, UV cured in $O_2$, and UV cured in $N_2$.

The FTIR spectra of HSQ-based low-k films are characterized by the Si—H band near 2200 $cm^{-1}$, a band near 850 $cm^{-1}$ which is attributed to a SiO—H stretch mode and the two Si—O peaks near 1100 $cm^{-1}$. The curing of these films which typically results in a modulus increase of 100% or more is reflected in the FTIR spectra by the complete removal of the Si—H band, and the change in ratio of cage vs. network Si—O bonds.

The UV treatment can successfully cure the HSQ-based low-k films. FIG. 2 shows FTIR spectra for HSQ-based low-k films: uncured (dotted line), UV cured for 60 seconds in $O_2$ (dashed line), and $N_2$ (solid line). However, the efficiency for the curing is dependent on the chamber purge gas composition. It has been observed that $O_2$ is more effective for the UV curing than $N_2$.

EXAMPLE 3

HSQ/MSQ Mixed Low-k Film

Figure 3:
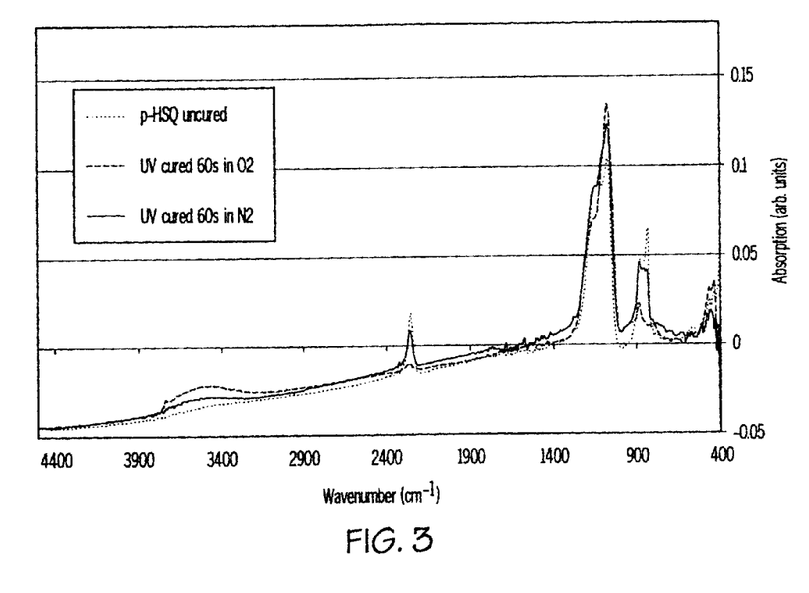
FIG. 3 is a chart illustrating the FTIR spectra for 5% MSQ/95% HSQ-based spin-on low-k films which were uncured, UV cured in $O_2$, and UV cured in $N_2$.

The FTIR spectra of HSQ/MSQ-mixed low-k films are characterized by the usual Si—H band near 2200 $cm^{-1}$, the SiO—H stretch mode band near 850 $cm^{-1}$ and the two Si—O peaks near 1100 $cm^{-1}$. In addition there is the Si—$CH_3$ characteristic feature near 1280 $cm^{-1}$. For this specific example a 5% MSQ/95% HSQ mixed film has been studied. The UV curing of these films exhibits a much stronger dependence on the UV purge gas mixture than the pure HSQ-based film. Nevertheless, the $O_2$ purged UV treatment results in an effective and successful curing of the low-k films.

FIG. 3 shows FTIR spectra for 5% MSQ/95% HSQ-based low-k films: uncured (dotted line), UV cured for 60 seconds in $O_2$ (dashed line), and $N_2$ (solid line). For all cases a subsequent or possibly concomitant anneal step is necessary in order to remove the Si—OH bonds which are typically generated during the UV curing process.

EXAMPLE 4

SiCOH CVD Low-k Film

Figure 4:
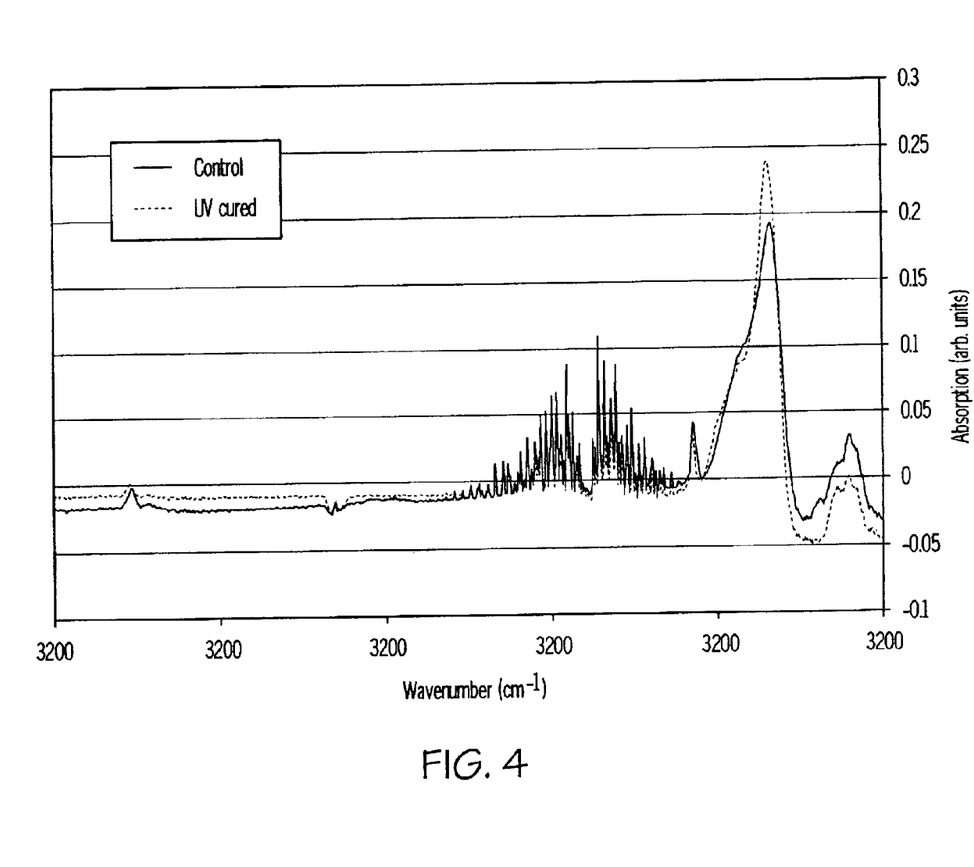
FIG. 4 is a chart illustrating the FTIR spectra for CVD low-k films which were uncured and UV cured.

The FTIR spectra of SiCOH CVD low-k films are characterized by a Si—$CH_3$ band near 1230 $cm^{-1}$, a C—H band near 2950 $cm^{-1}$, as well as two Si—O peaks near 1100 $cm^{-1}$. The curing of these films, which typically results in an elastic modulus and material hardness increase of about 50% or more, is reflected in the FTIR spectra by a change in ratio of the two Si—O bands, which indicates increased networking. Although some reduction in the Si—$CH_3$ and C—H bands are typically seen, reduction of these particular bands is preferably minimized or eliminated.

The UV treatment can successfully cure the SiCOH CVD low-k film. FIG. 4 shows FTIR spectra for a CVD low-k film: uncured (solid line) and UV cured (dotted line) for 120 seconds in He. The UV cure was done with a HL bulb, a He purge at atmospheric pressure of the process chamber, and a wafer temperature of about 380° C.

While certain representative embodiments and details have been shown for purposes of illustrating the invention, it will be apparent to those skilled in the art that various changes in the compositions and methods disclosed herein may be made without departing from the scope of the invention. Accordingly, it is intended that the invention not be limited to the disclosed embodiments, but that it have the full scope permitted by the language of the following claims.

What is claimed is:

1. A process for making a UV cured material comprising:
   providing a dielectric material having a first dielectric constant, having a first elastic modulus, and having a first material hardness; and
   UV curing the dielectric material to produce a UV cured dielectric material having a second dielectric constant which is within about ±20% of the first dielectric constant, having a second elastic modulus which is greater than the first elastic modulus, and having a second material hardness which is greater than the first material hardness.

2. The process of claim 1 wherein the dielectric material is selected from an organic material, an inorganic material, or a combination thereof.

3. The process of claim 1 wherein the dielectric material is selected from a hydrogen silsesquioxane (HSQ) dielectric material, a methylsilsesquioxane (MSQ) dielectric material, a carbon doped oxide (CDO) dielectric material, a hydrogenated silicon oxy-carbide (SiCOH) dielectric material, a benzocyclobutene (BCB) dielectric material, an arylcyclobutene based dielectric material, a polyphenylene based dielectric material, or a combination thereof.

4. The process of claim 1 wherein the dielectric material is produced by depositing a dielectric coating on a substrate using a spin-on process, a chemical vapor deposition process, a plasma assisted chemical vapor deposition process, an evaporation process, a reactive evaporation process or a self assembled deposition process.

5. The process of claim 1 wherein the dielectric material is selected from a dense dielectric material, a porogen-generated porous dielectric material, a solvent-formed porous dielectric material, or a molecular engineered porous dielectric material, or combinations thereof.

6. The process of claim 1 wherein the dielectric material is UV cured for no more than or about 300 seconds.

7. The process of claim 1 wherein the dielectric material is UV cured for between about 60 and about 180 seconds.

8. The process of claim 1 wherein the dielectric material has a wafer temperature that is greater than or about 80° C. during UV curing.

9. The process of claim 1 wherein the dielectric material has a wafer temperature that is between about room temperature and about 450° C. during UV curing.

10. The process of claim 1 wherein the dielectric material is UV cured at a process pressure that is less than or about equal to atmospheric pressure.

11. The process of claim 1 wherein the dielectric material is UV cured at a process pressure that is greater than or about equal to atmospheric pressure.

12. The process of claim 1 wherein the dielectric material is UV cured at a UV power between about 0.1 and about 2000 mW/cm$^2$.

13. The process of claim 1 wherein the dielectric material is UV cured with a process gas purge, wherein the purge gas is selected from $N_2$, $O_2$, Ar, He, $H_2$, $H_2O$ vapor, $CO_z$, $C_xH_y$, $C_xF_y$, $C_xH_zF_y$, air, and combinations thereof, and wherein x is an integer between 1 and 6, y is an integer between 4 and 14, and z is an integer between 1 and 3.

14. The process of claim 1 wherein the dielectric material is UV cured using a UV wavelength spectrum between about 100 nm and about 400 nm.

15. The process of claim 1 wherein the increase in elastic modulus between the first elastic modulus of the dielectric material and the second elastic modulus of the UV cured dielectric material is greater than or about 50%.

16. The process of claim 1 wherein the second elastic modulus of the UV cured dielectric material is greater than or about 2.5 GPa.

17. The process of claim 1 wherein the second elastic modulus of the UV cured dielectric material is between about 4 GPa and about 12 GPa.

18. The process of claim 1 wherein the increase in material hardness between the first material hardness of the dielectric material and the second material hardness of the UV cured dielectric material is greater than or about 50%.

19. The process of claim 1 wherein the second material hardness of the UV cured dielectric material is greater than or about 0.25 GPa.

20. The process of claim 1 wherein the second material hardness of the UV cured dielectric material is between about 0.25 and about 1.2 GPa.

21. The process of claim 1 further comprising post-UV treating the UV cured dielectric material to provide a post-UV treated, UV cured dielectric material having a third dielectric constant which is less than the second dielectric constant, having a third elastic modulus which is greater than or within about ±20% of the second elastic modulus, and having a third material hardness which is greater than or within about ±20% of the second material hardness.

22. The process of claim 21 wherein the third dielectric constant of the post-UV treated, UV cured dielectric material is between about 1.1 and about 3.5.

23. The process of claim 21 wherein the third dielectric constant of the post-UV treated, UV cured dielectric material is between about 1.6 and about 2.4.

24. The process of claim 21 wherein the post-UV treating is thermal annealing.

25. The process of claim 24 wherein the UV cured dielectric material is annealed at a temperature less than or about 450° C.

26. The process of claim 24 wherein the UV cured dielectric material is annealed at a temperature between about 150 and about 450° C.

27. The process of claim 24 wherein the UV cured dielectric material is annealed for no more than or about 60 minutes.

28. The process of claim 21 wherein the post-UV treating is plasma treating by exposing the UV cured dielectric material to a plasma condition at elevated temperatures.

29. The process of claim 28 wherein the UV cured dielectric material is plasma treated at a plasma power between about 500 and about 3000 W.

30. The process of claim 28 wherein the UV cured dielectric material is plasma treated at a temperature between about 100 and about 450° C.

31. The process of claim 28 wherein the UV cured dielectric material is plasma treated for no more than or about 90 seconds.

32. The process of claim 28 wherein the UV cured dielectric material is plasma treated at a process pressure between about 1 Torr and about 10 Torr.

33. The process of claim 28 wherein the UV cured dielectric material is plasma treated with a plasma gas, wherein the plasma gas is selected from $N_2$, $O_2$, Ar, He, $H_2$, $C_xH_y$, fluorine-containing gas, or combinations thereof, and wherein x is an integer between 1 and 6, and y is an integer between 1 and 14.

34. The process of claim 21 wherein the post-UV treating is UV treating by exposing the UV cured dielectric material to a UV condition.

35. The process of claim 34 wherein the UV cured dielectric material is UV treated for no more than or about 300 seconds.

36. The process of claim 34 wherein the UV cured dielectric material is UV treated for between about 60 and about 180 seconds.

37. The process of claim 34 wherein the UV cured dielectric material is UV treated at a temperature between about room temperature and about 450° C.

38. The process of claim 34 wherein the UV cured dielectric material is UV treated at a process pressure that is less than or about equal to atmospheric pressure.

39. The process of claim 34 wherein the UV cured dielectric material is UV treated at a process pressure that is greater than or about equal to atmospheric pressure.

40. The process of claim 34 wherein the UV cured dielectric material is UV treated at a UV power between about 0.1 and about 2000 mW/cm$^2$.

41. The process of claim 34 wherein the UV cured dielectric material is UV treated with a process gas purge, wherein the purge gas is selected from $N_2$, $O_2$, Ar, He, $H_2$, $H_2O$ vapor, $CO_2$, $C_xH_y$, $C_xF_y$, $C_xH_zF_y$, air, and combinations thereof, and wherein x is an integer between 1 and 6, y is an integer between 4 and 14, and z is an integer between 1 and 3.

42. The process of claim 34 wherein the UV cured dielectric material is UV treated using a UV wavelength spectrum between about 100 nm and about 400 nm.

43. The process of claim 1 wherein the UV curing occurs at vacuum conditions or at conditions without the presence of oxygen or oxidizing gases.

44. The process of claim 1 further comprising:
  placing the dielectric material into a process chamber;
  evacuating or purging the process chamber to remove room air;
  supplying a process gas to the process chamber;
  heating the dielectric material to a process temperature of about 450° C. or less; and
  exposing the dielectric material to UV radiation with wavelengths in the region of between about 100 and about 400 nm.

45. The process of claim 44 wherein the UV radiation is provided by a UV light source selected from a microwave driven light source, an arc discharge light source, a dielectric barrier discharge light source, or an electron impact generated light source.

46. The process of claim 44 wherein the dielectric material is heated by a heat source selected from an infrared light source, an optical light source, a hot surface, or a UV light source.

47. A process for making a UV cured material comprising:
  providing an uncured advanced low-k dielectric material; and
  UV curing the dielectric material at a time of no greater than about 5 minutes, or at a temperature of no greater than about 450° C. to produce a UV cured dielectric material, wherein the total thermal budget of the UV curing is reduced by greater than about 50% as compared to a furnace curing process.

48. The process of claim 47 wherein the dielectric material is UV cured using a UV wavelength spectrum between about 100 nm and about 400 nm.

49. The process of claim 47 wherein the dielectric material is UV cured with a process gas purge, wherein the purge gas is selected from $N_2$, $O_2$, Ar, He, $H_2$, $H_2O$ vapor, $CO_2$, $C_xH_y$, $C_xF_y$, $C_xH_zF_y$, air, and combinations thereof, and wherein x is an integer between 1 and 6, y is an integer between 4 and 14, and z is an integer between 1 and 3.

50. The process of claim 47 wherein the dielectric material is UV cured at a UV power between about 0.1 and about 2000 mW/cm$^2$.

51. The process of claim 47 wherein the dielectric material is UV cured at a process pressure that is greater than or about equal to atmospheric pressure.

52. The process of claim 47 wherein the dielectric material is UV cured at a process pressure that is less than or about equal to atmospheric pressure.

53. The process of claim 47 wherein the dielectric material has a wafer temperature that is between about room temperature and about 450° C. during UV curing.

54. The process of claim 47 wherein the dielectric material is UV cured for between about 60 and about 180 seconds.

55. The process of claim 47 wherein the dielectric material is selected from a dense dielectric material, a porogen-generated porous dielectric material, a solvent-formed porous dielectric material, or a molecular engineered porous dielectric material, or combinations thereof.

56. The process of claim 47 wherein the dielectric material is selected from an organic material, an inorganic material, or a combination thereof.

57. The process of claim 47 wherein the dielectric material is selected from a hydrogen silsesquioxane (HSQ) dielectric material, a methylsilsesquioxane (MSQ) dielectric material, a carbon doped oxide (CDO) dielectric material, a hydrogenated silicon oxy-carbide (SiCOH) dielectric material, a benzocyclobutene (BCB) dielectric material, an arylcyclobutene based dielectric material, a polyphenylene based dielectric material, or a combination thereof.

58. The process of claim 47 wherein the dielectric material is produced by depositing a dielectric coating on a substrate using a spin-on process, a chemical vapor deposition process, a plasma assisted chemical vapor deposition process, an evaporation process, a reactive evaporation process or a self assembled deposition process.

* * * * *